US007992967B2

United States Patent
Yamanaka

(10) Patent No.: US 7,992,967 B2
(45) Date of Patent: Aug. 9, 2011

(54) LIQUID DROP EJECTION HEAD AND IMAGE FORMING APPARATUS

(75) Inventor: Kunihiro Yamanaka, Kanagawa-ken (JP)

(73) Assignee: Ricoh Company, Ltd., Tokyo (JP)

( * ) Notice: Subject to any disclaimer, the term of this patent is extended or adjusted under 35 U.S.C. 154(b) by 344 days.

(21) Appl. No.: 12/389,834

(22) Filed: Feb. 20, 2009

(65) Prior Publication Data

US 2009/0213182 A1 Aug. 27, 2009

(30) Foreign Application Priority Data

Feb. 23, 2008 (JP) ................................. 2008-042275

(51) Int. Cl.
*B41J 2/14* (2006.01)
(52) U.S. Cl. ................ 347/50; 347/68; 347/58
(58) Field of Classification Search .......... 347/50, 347/58–62, 68, 55
See application file for complete search history.

(56) References Cited

U.S. PATENT DOCUMENTS

| 6,568,794 | B2 | 5/2003 | Yamanaka et al. | |
|---|---|---|---|---|
| 7,438,389 | B2 * | 10/2008 | Katayama | 347/50 |
| 7,699,438 | B2 * | 4/2010 | Kubo | 347/50 |
| 2006/0279603 | A1 | 12/2006 | Kusunoki et al. | |

FOREIGN PATENT DOCUMENTS

| JP | 10-109410 | 4/1998 |
|---|---|---|
| JP | 2002-46256 | 2/2002 |
| JP | 2002-321371 | 11/2002 |
| JP | 2004-90481 | 3/2004 |

OTHER PUBLICATIONS

U.S. Appl. No. 11/786,725, filed Apr. 11, 2007.

\* cited by examiner

*Primary Examiner* — Lamson D Nguyen
(74) *Attorney, Agent, or Firm* — Cooper & Dunham LLP

(57) ABSTRACT

A liquid drop ejection head unit includes plural lines of plural nozzles formed on a nozzle plate, plural lines of plural drive elements that generate energy for ejecting liquid drop through the plural nozzles, and plural sheets of flexible printed circuit boards that input signals to the plural drive elements. The sheets of flexible printed circuit boards include input and output terminals for taking in and output a signal to one of the plural drive elements. A wiring board is provided to connect to the input terminals of the plural sheets of flexible printed circuit boards. The wiring board is arranged in parallel to the nozzle line within a width of nozzle plate. The plural sheets of the flexible printed boards are arranged opposing to each other via the wiring board. The input terminals are positioned not to face each other.

7 Claims, 16 Drawing Sheets

LIQUID DROP EJECTION HEAD AND IMAGE FORMING APPARATUS

CROSS REFERENCE TO RELATED APPLICATION

This application claims priority under 35 USC §119 to Japanese Patent Application No. 2008-042275, filed on Feb. 23, 2008, the entire contents of which are herein incorporated by reference.

BACKGROUND OF THE INVENTION

1. Field of the Invention

The present invention relates to a liquid drop ejection head and an image forming apparatus.

2. Discussion of the Background Art

In general, an image forming apparatus, such as a printer, a fax, a copier, a plotter, a multifunction machine combining these functions, etc., sometimes includes a print head having a liquid drop ejection head for ejecting ink drop and executes image formation by adhering the ink drop to a sheet, such as a recordation medium, a transfer member, etc., while conveying the sheet.

Specifically, the image forming apparatus can execute the image formation by ejecting liquid drop onto a medium, such as paper, textile thread, texture, cloth, leaser, metal, plastic, glass, wood, ceramics, etc. The image formation provides the medium with not only an image having meaning, such as character, figure, etc., but also a meaningless image, such as a pattern etc. The ink includes wide range of material as far as it can become a liquid state, such as DNA test piece, registration, pattern material, etc., when ejected.

In such an image forming apparatus, as an image processing device, such as a personal computer etc., progresses, a printing speed increases while improving a quality of an image. To achieve the high-speed printing, the print head is elongated by increasingly employing a number of nozzles or is made in a line state connecting plural heads.

Further, as one of attempts to obtain the high quality image, a multiple nozzle headline is employed to use many ink colors. Thus, in comparison with the conventional one, a printing apparatus mounting such a print head becomes bulky and expensive. Accordingly, a printing head or a carriage mounting the print head are demanded to be more downsized at low cost.

A flexible printed circuit (FPC) board is utilized to provide an electric signal such as printing information from a printing apparatus body side to a printing head.

In the past, as shown in the Japanese Patent Application Laid Open No. 2002-046256, a flexible printed circuit board is arranged at both side surfaces of a nozzle of a printing head, and one ends of the flexible printed circuit boards are connected to an actuator of the printing head with the other ends being connected to a connecter electrically connected to a printing apparatus body side.

The Japanese Patent Application Laid Open No. 2002-090481 describes that two lines of drive elements are provided, while two drive circuit boards of the same shape are arranged thereto respectively on the same side of those.

Further, the Japanese Patent Application Laid Open No. 2002-321371 provides a flexible printed circuit board with its connection sections connecting to a printing head. Specifically, the flexible printed circuit board is perpendicularly bent in a lengthwise direction between the printing head and a drive circuit board to be folded back by the angle of 180 degree so that the connection sections are arranged opposing each other.

However, since the connecting parts are similarly arranged opposing to each other on both sides of the nozzle as the flexible printed circuit boards in the conventional art of the Japanese Patent Application Laid Open No. 2002-046256, the printing head cannot be thinned.

Further, since the drive circuit board needs two sheets of the flexible printed circuit boards, a number of parts and accordingly the cost, increases in the conventional art of the Japanese Patent Application Laid Open No. 2002-090481. When it is attempted to use only one sheet of the drive circuit board, since input terminals to two sheets of the flexible printed circuit boards are arranged opposing each other via the drive circuit board, wiring is overcrowded on the drive circuit board, and a stacking number of layer of the drive circuit boards unavoidably increases. As a result, cost of the board increases.

As described in the Japanese Patent Application Laid Open No. 2002-321371, even though part cost is decreased by folding back the common part of the flexible printed circuit board, the carriage with the printing head is insufficiently downsized, and the part cost is insufficiently reduced.

Further, as illustrated in FIG. 25, when a line type head unit 1000 of a line type image forming apparatus includes plural short heads being staggered and held by a head supporting member 1002, the head unit 1000, and accordingly the apparatus as a whole become extraordinary bulky. The length L of the head unit 1000 depends on a size of a printing medium used in an apparatus. However, the width W of the head unit 1000 does not depend on the size and directly affects the size of the entire apparatus. Since the width per head 1001 is w, the total width W of the head unit 1000 amounts to 2×w. Thus, decreasing the width w per head 1001 means decreasing the head unit 1000.

Thus, it is important and thus is demanded to decrease the width of the head unit for downsizing the line type apparatus body. A serial type printing head has the same demand. Because, when a printing head is wide, a scanning range of a carriage is also wide, so that downsizing and high-speed printing of the apparatus cannot be promoted.

SUMMARY OF THE INVENTION

The present invention has been made in view of the above noted and another problems and one object of the present invention is to provide a new and noble liquid drop ejection head unit.

Such a new and noble liquid drop ejection head unit includes plural lines of plural nozzles formed on a nozzle plate, plural lines of plural drive elements that generate energy for ejecting liquid drop through the plural nozzles, and plural sheets of flexible printed circuit boards that input signals to the plural drive elements. The sheets of flexible printed circuit boards include input and output terminals for taking in and output a signal to one of the plural drive elements. A wiring board is provided to connect to the input terminals of the plural sheets of flexible printed circuit boards. The wiring board is arranged in parallel to the nozzle line within a width of nozzle plate. The plural sheets of the flexible printed boards are arranged opposing to each other via the wiring board. The input terminals are positioned not to face each other.

In another embodiment, the sheet of flexible printed circuit board is folded into a half around an axis in parallel the line of the nozzle and is attached to the nozzle plate. The plural input terminals are arranged not to face each other.

In yet another embodiment, the input terminal is displaced from a center of one of the drive elements.

In yet another embodiment, a length of the input terminal is not more than a half of the output terminal.

In yet another embodiment, two sheets of flexible printed boards are formed substantially in the same shape.

In yet another embodiment, the wiring board mounts a bypass condenser.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
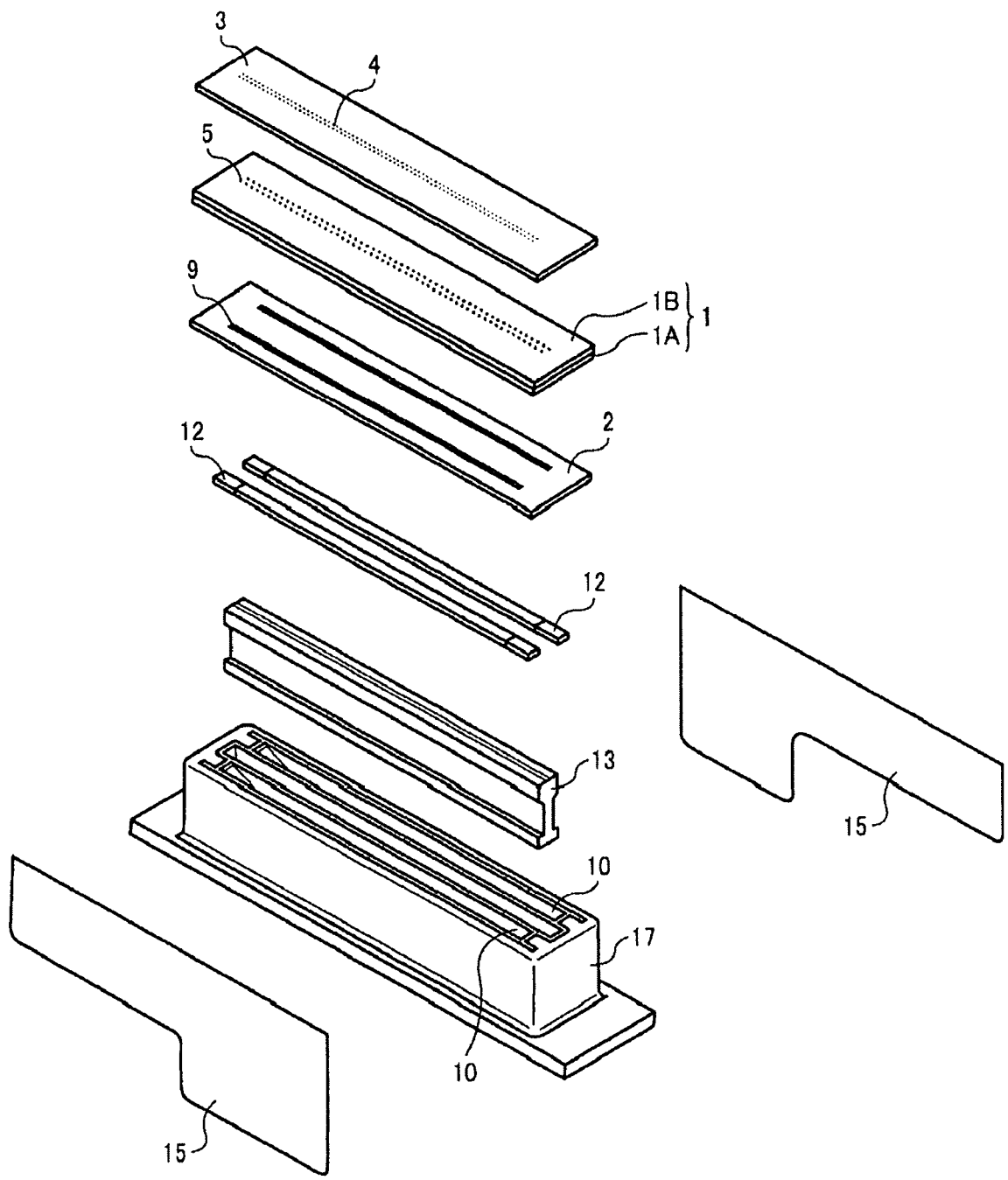
FIG. 1 is a perspective explosion diagram illustrating an exemplary liquid drop ejection head according to a first embodiment of the present invention.
Figure 2:
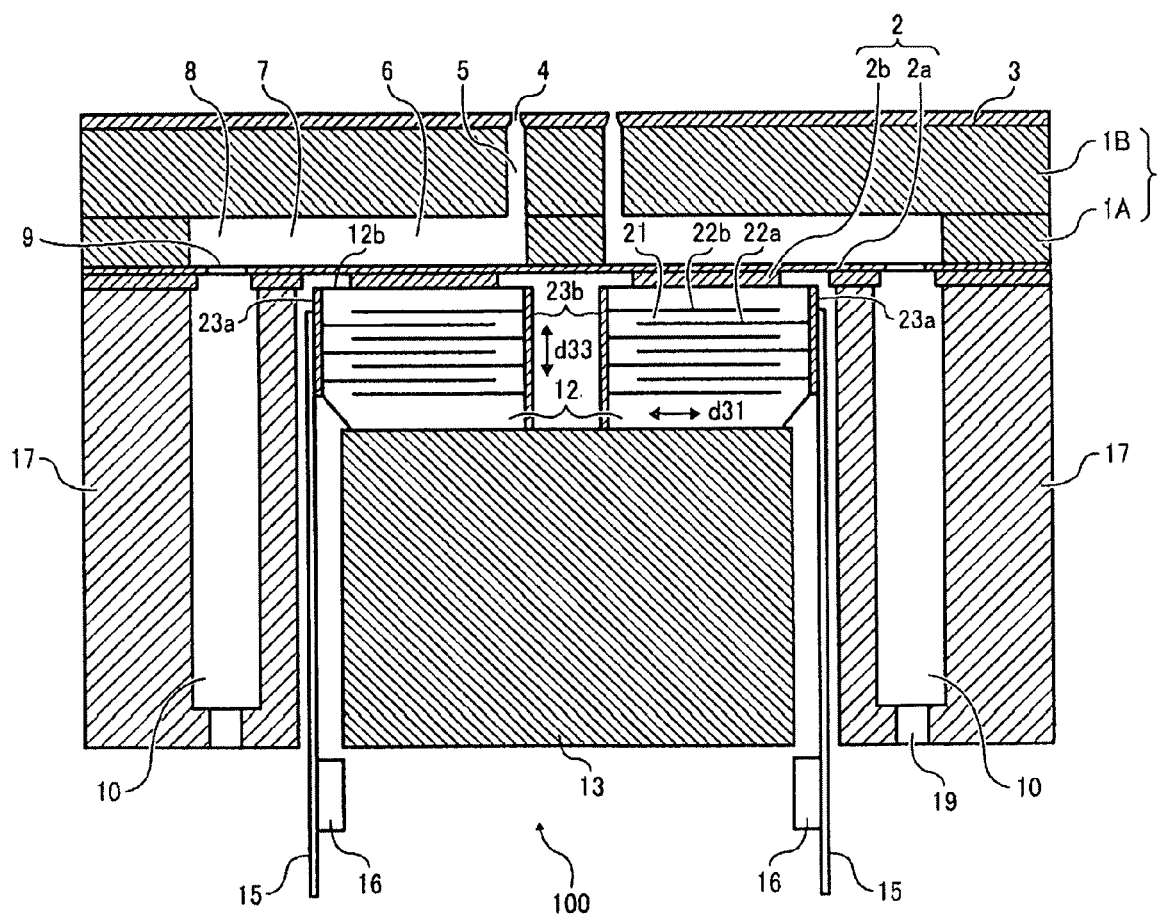
FIG. 2 is a cross sectional view illustrating the liquid drop ejection head when viewed in a direction perpendicular to a nozzle arrangement direction.

Referring now to the drawings, wherein like reference numerals and marks designate identical or corresponding parts throughout several figures, in particular In FIGS. 1 to 4, an exemplary liquid drop ejection head is described.

The liquid drop ejection head includes a flow channel substrate 1 having a SUS substrate, a vibration plate member 2 connected to the bottom surface of the flow channel substrate 1, and a nozzle plate 3 connected to the upper surface of the flow channel substrate 1. Plural nozzles 4 are formed on the nozzle plate 3 to eject liquid drop. Plural liquid rooms 6 (sometimes called a pressure applying liquid room, a pressure room, a pressure applying room, or a flow channel) are formed to communicate with the plural nozzles 4 via nozzle communication passes 5. Plural communication sections 8 are formed to communicate with the liquid rooms 6 via plural fluidity resistance sections 7. Ink is supplied from a common liquid room 10 formed on a frame member 17 mentioned later in detail to the communication sections 8 via supplying inlets 9 formed on the vibration plate member 2.

The flow channel substrate 1 is produced by adhering a flow channel plate 1A to a communication plate 1B. Plural openings of the communication paths 5, the pressure applying liquid rooms 6, and the fluidity resistance sections 7 are formed in the flow channel substrate 1 by etching the SUS substrate with acidic etching liquid or executing machine processing, such as pressure punching, etc.

The vibration plate member 2 includes plural vibration regions (diaphragm sections) forming wall surfaces of the liquid rooms 6, respectively. Plural island state convexes 2b are formed on the outside of the vibration regions 2a (on the opposite side of the liquid room 6). To the island state convexes 2b, upper end surfaces of piezoelectric element fulcrums 12A and 12B of layer type piezoelectric elements 12 serving as drive elements (i.e., actuator devices, or pressure generation devices) are connected, respectively, to displace the vibration regions 2a and generate energy for ejecting liquid drop. The lower end surfaces of the layer type piezoelectric elements 12 are connected to a base member 13.

The piezoelectric element 12 is formed by laminating piezoelectric material layers 21 like a PZT with internal electrodes 22a and 22b one after the other. The inner electrodes 22a and 22b are withdrawn to the respective side surfaces almost perpendicular to the vibration plate 2 of the piezoelectric element 12, and connected to end electrodes (i.e., external electrodes) 23a and 23b arranged on the side surfaces. Thus, a voltage is applied to the end electrodes 23a and 23b, a displacement occurs in the laminating direction. A prescribed number of piezoelectric element fulcrums 12A and 12B are formed per piezoelectric element member by applying groove processing of half cut dicing to a piezoelectric element 12.

Figure 3:
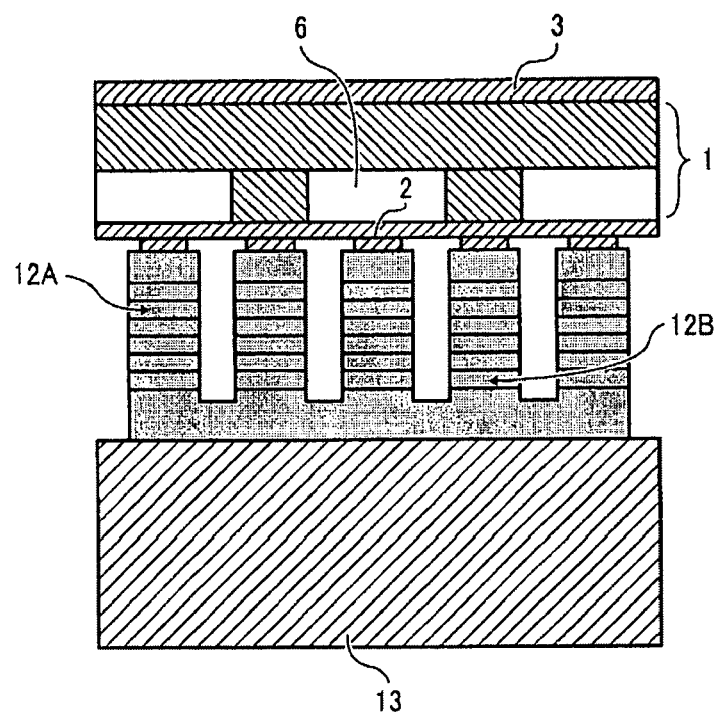
FIG. 3 is a cross sectional view illustrating the liquid drop ejection head when viewed in the nozzle arrangement direction.
Figure 4:
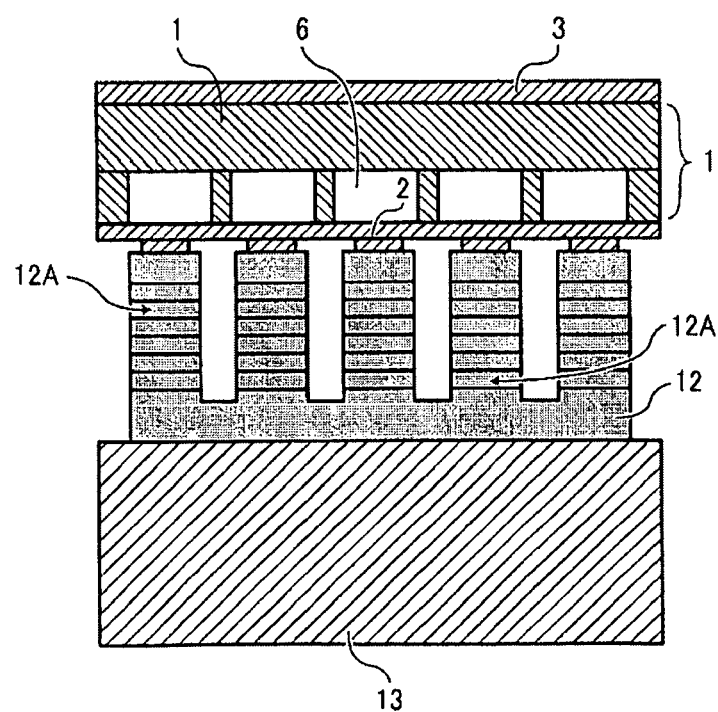
FIG. 4 is a cross sectional view illustrating another exemplary liquid drop ejection head when viewed in the nozzle arrangement direction.

These piezoelectric element fulcrums 12A and 12B are the same type. However, the piezoelectric element fulcrum 12A is drive when a drive waveform signal is provided, while the peep 12B is simply used as a fulcrum to which the drive waveform signal is not provided. For example, these drive use and support fulcrum use piezoelectric element fulcrums 12A and 12B are arranged alternatively as shown in FIG. 3, or all of the piezoelectric element fulcrums 12A are arranged as shown in FIG. 4.

Thus, two drive element lines (i.e. lines of drive use piezoelectric element fulcrums 12A) are arranged as drive elements on a base member 13, each including arrangement of plural drive use piezoelectric element fulcrums 12A.

Although, ink in the liquid room 6 is pressurized by displacement in a direction of d33 as a piezoelectric direction of the laminated type piezoelectric element 12, that of d31 can be used for the same purpose.

Instead of using the abovementioned material for the piezoelectric element, an electricity/machine conversion element, such as intensive dielectric material like $BaTiO_3$, $PbTiO_3$, and $(NaK)NbO_3$ can be used. Instead of using the laminated type piezoelectric element, a single plate piezoelectric element produced by a cutting process, a thick film type obtained by executing screen printing and sintering, or a thin film type obtained by executing sputtering or evaporation as well as using sol-gel process can be employed. Further, one or more lines of the laminate type piezoelectric elements 12 can be arranged on a single base member 13.

Further, a flexible printed circuit board 15 serving as a wiring device is connected to the external electrode 23a of the respective drive use piezoelectric element fulcrums 12A of the piezoelectric element 12 using a desoldering member to provide a drive signal. A drive circuit (a driver IC) 16 is mounted on the flexible printed circuit board 15 to selectively apply the drive waveform signal to each of the drive use piezoelectric element fulcrums 12A of the piezoelectric element 12. All of the external electrodes 23b of the piezoelectric element fulcrum 12A are electrically connected to a common wiring (not shown) formed on the FPC 15 using desoldering connection. Desoldering coating is applied to an output terminal section of the FPC 15 connecting to the piezoelectric element 12 to achieve desolder connection. However, the desolder coating can be applied to the piezoelectric element 12 not the FPC 15. Such connection can be achieved using an anisotropy conductive film or wire bounding beside the desoldering.

The nozzle plate 3 is formed using a metal plate made of nickel (Ni), and is manufactured by using an electro forming method (i.e., electrotyping). The nozzles 4 have a diameter of from 10 to 35 micrometer are formed on the nozzle plate 3 adhered to the flow pass plate 1 using adhesion. A watershedding layer is arranged on the surface of the nozzle plate 3 on a liquid drop ejection side (i.e., a surface in an ejection direction or a surface opposite to a side of the liquid room 6).

A frame member 17 made of epoxy resin or polyphenylene sulfide and produced by using injection molding is connected to the outer circumferential side of a piezoelectric type actuator unit 100, which includes the piezoelectric element 12 mounting the FPC 15 and the base member 13 or the like.

Then, the above-mentioned common liquid room 10 is formed on the frame member 17. A supply inlet 19 is also formed to intake ink to the common liquid room 10 from the outside thereof. The supply inlet 19 is connected to an ink supply source, such as a sub tank, an ink cartridge, etc., not shown.

In thus constructed liquid drop ejection head, the piezoelectric element fulcrum 12A shrinks when a voltage to be applied to the drive use piezoelectric element fulcrum 12A is decreased from a reference level. Simultaneously, the vibration plate 2 descends and a capacity of the liquid room 6 increases, so that the ink enters the liquid room 6. When the voltage applied 2 to the piezoelectric element fulcrum 12A is increased, the piezoelectric element fulcrum 12A is expanded in the laminating direction and the vibration plate is deformed in a direction of the nozzle 4. Thus, the capacity or a cubic volume of the liquid room 6 is decreased. As a result, the ink in the liquid room 6 is pressurized, so that ink drop is ejected from the nozzle 4.

Then, the voltage applied to the piezoelectric element fulcrum 12A is brought back to the reference level, the vibration plate 2 returns to an initial position. Since the liquid room 6 expands and thereby creating a negative pressure, the ink is replenished into the liquid room 6 from the common liquid room 10. After vibration of a meniscus plane of the nozzle 4 is attenuated and becomes stable, another operation is executed for the next liquid drop ejection is started.

A head-driving manner is not limited to that as described above. Depending on a manner of providing the drive waveform signal, pull hitting or push hitting can be executed.

Figure 5:
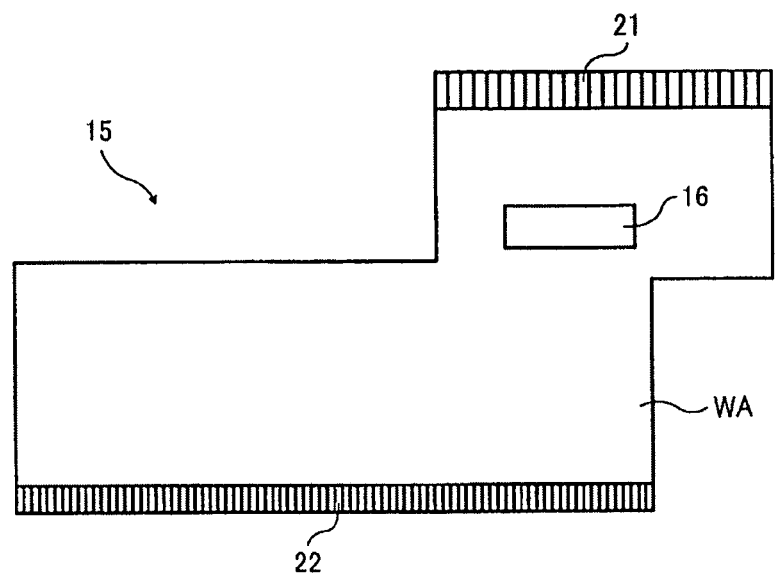
FIG. 5 is a chart illustrating an exemplary flexible printed circuit board according to one embodiment of the present invention.
Figure 6:
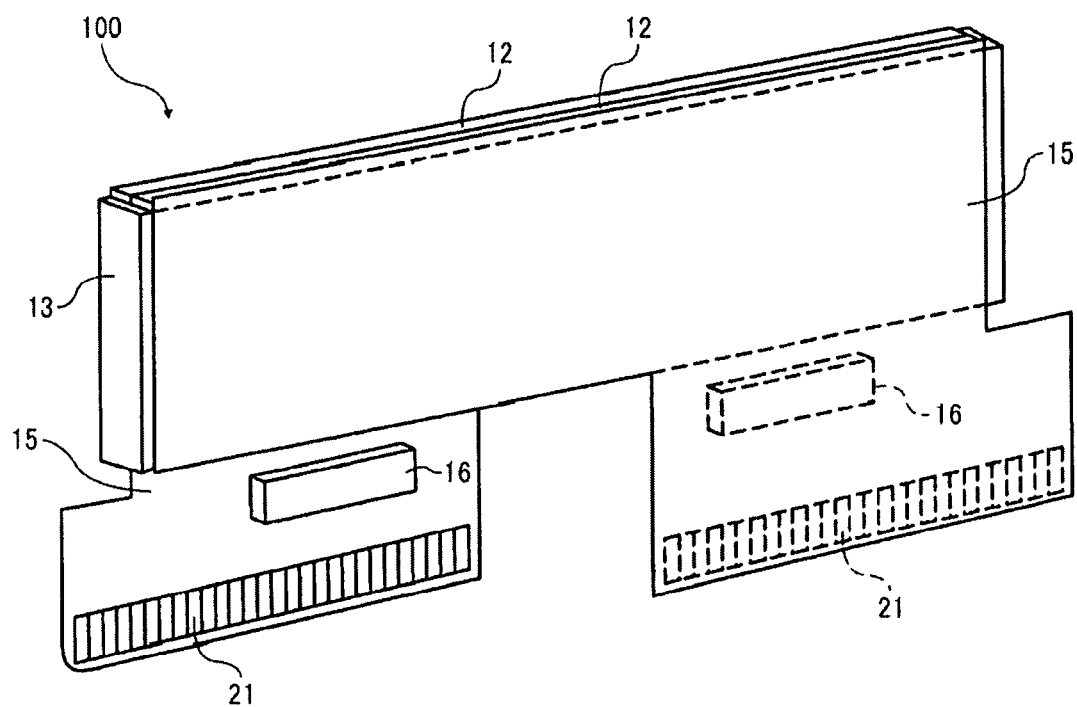
FIG. 6 is a perspective view illustrating an exemplary actuator unit of a liquid drop ejection head that mounts the flexible printed circuit board of FIG. 5.

Now, a first embodiment of the present invention is described with reference to FIGS. 5 to 7. As shown in FIG. 5, each of piezoelectric elements 12 serving as a drive element and a drive IC 16 for selectively applying a drive waveform to a drive use piezoelectric element fulcrum 12A are mounted on a FPC 15. When a number of wiring increases as that of the nozzle increases and the drive IC 16 is mounted either on a control section of an apparatus body or on a relay substrate connected to the apparatus controller, connecting of a drive element (i.e., a drive use piezoelectric element fulcrum 12A) to the driver IC16 becomes difficult. However, by wiring the drive element to the driver IC16 using the FPC15 obtained by wiring processing at a fine pitch, the mounting become easier. Further, a number of connection wirings connecting to either the apparatus body control section or the relay substrate can be decreased. As a result, connection to the apparatus body control section can be readily achieved. Further, it is preferable to decrease capacitance of wiring for communicating a high-speed signal between the drive element and the driver IC16. Specifically, to wire as short as possible, the driver IC16 is preferably mounted on the FPC 15 connecting to the drive element.

On the FPC 15, a connection terminal section (i.e., an output terminal section) 22 connected to the piezoelectric element 12 and that (i.e., an input terminal section) 21 receiving data and a signal from the apparatus body side section are arranged. The input terminal section 21 is deviated from the center of the output terminal section 2 toward the one side end thereof.

In the actuator unit 100, piezoelectric elements 12, 12 having plural drive use piezoelectric elements 12A are arranged on the baseboard 13 to form two lines. For the lines of the respective piezoelectric element fulcrums 12A, two sheets of the FPC 15, 15 are arranged facing each other sandwiching the baseboard 13. The respective input terminal sections 21, 21 are not arranged facing each other. Thus, the input terminal section 21 dos not position at the center S of the actuator unit 100.

Thus, even if the ink supply inlet 19 is arranged in the vicinity of the center in the lengthwise direction of the liquid drop ejection head, the FPC 15 doe not interfere with an ink tube connected to the ink supply inlet 19 for the purpose of supplying ink and a packing or the like (not shown). As a result, a structure capable of avoiding leakage of the ink from the ink supply inlet 19 can be readily obtained. Thus, by arranging the ink supply inlet about in the vicinity of the center of the liquid drop ejection head, supplying of the ink can be constant.

Figure 7:
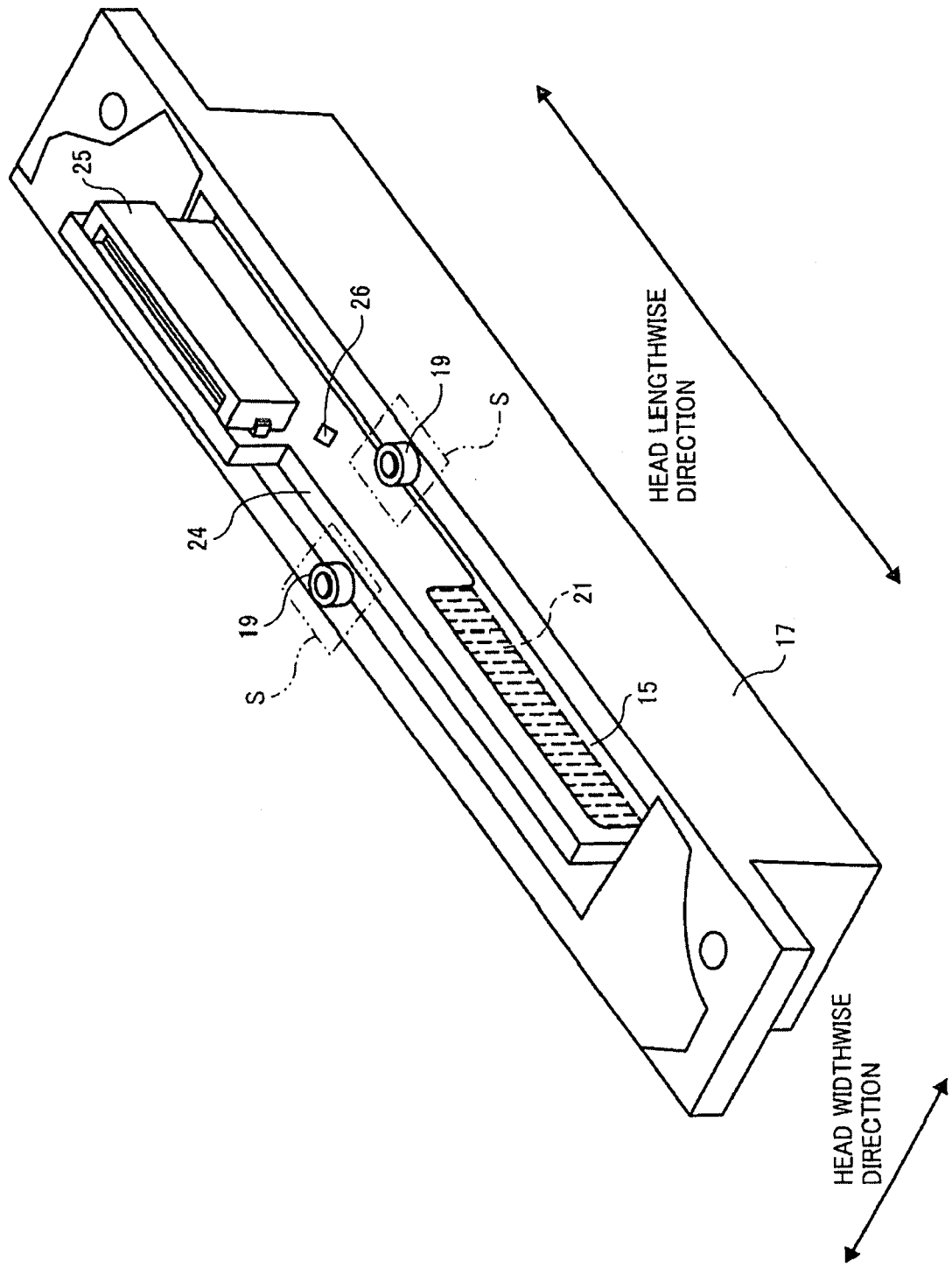
FIG. 7 is a perspective view illustrating a liquid drop ejection head that mounts a wiring board when viewed from an opposite side to a nozzle surface thereof.

As shown in FIG. 7, the input terminal section of the FPC 15 is connected to the connection terminal of the wiring board 24 to conduct electricity. The wiring board 24 is arranged perpendicular to the surface of the nozzle 4 on the liquid drop ejection head, and is extending in a lengthwise direction thereof. The wiring board 24 is arranged within the width of the nozzle surface (i.e., the shorter lengthwise direction of the liquid drop ejection head). Although plural FPCs 15, 15 are arranged opposing to each other sandwiching the wiring board 24, the input terminal sections 21, 21 connected to the wiring board 24 do not face each other.

Thus, since the input terminal sections 21, 21 of the FPC 15 do not oppose to each other via the wiring board 24, concentration of wiring can be suppressed at the connection section of the wiring board 24. Further, since a number of layers of the wiring board 24 can be decreased, the cost thereof can be reduced.

Further, since the wiring board 24 is installed within the width of the liquid drop ejection head, the liquid drop ejection head can be downsized in the widthwise direction (i.e., a direction of arrangement of piezoelectric elements 12, 12, or a direction perpendicular to an arrangement direction of the nozzles 4), and accordingly, packaging can be performed saving a space while downsizing the liquid drop ejection head.

A connecter 25 is arranged on the wiring board 24 to connect to a substrate provided in the apparatus body control section. Further, as shown in FIG. 7, a bypass condenser 26 is preferably mounted on the wiring board 24 to constantly supply a signal to the drive IC 16. Since the bypass condenser 26 is mounted on the wiring board 24 not on the expensive FPC 15, the cost for the FPC 15 can be suppressed. When a FFC (Flexible Flat Cable) is used instead of the wiring board 24, the bypass condenser needs to be arranged on a FPC provided in the vicinity of the drive IC 16. However, the FPC grows mammoth resulting in cost up.

In this way, the liquid drop ejection head is downsized in the widthwise direction. Because, the plural drive element lines each having plural drive elements which generate energy for ejecting ink drop from a nozzle, plural flexible print boards for inputting a signal to the plural drive element lines, and the wiring board connected to the input terminals of the flexible print boards are assembled by arranging the wiring board perpendicular to that of the nozzle within the width of the surface of the nozzle in the widthwise direction, and arranging the flexible printed boards opposing to each other via the wiring board, as well as arranging the input terminals connected to the wiring board not facing each other. Further, concentration of wiring on the wiring board can be avoided while decreasing a number of layers of the wiring board at low cost.

Instead of using the piezoelectric element as a drive element as above, various drive elements, such as a thermal actuator that employs an electric heat conversion element (e.g. a heat generation resistance) utilizing a phase change caused by film boiling of liquid, a shape-memory alloy actuator that utilizes a metal phase change caused by a change in temperature, an electrostatic actuator that utilizes an electrostatic force, etc., van be employed.

Figure 8:
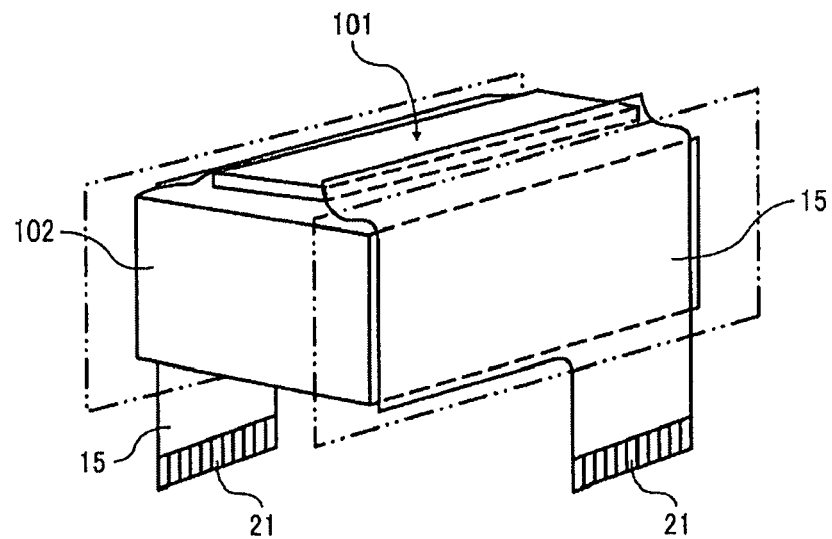
FIG. 8 is a perspective view illustrating a second embodiment according to the present invention.

Now, a second embodiment is described with reference to FIG. 8. As shown, an electrostatic type actuator unit 101 includes two lines of drive elements formed from plural lines of electrostatic type actuators on a base member 103. Two sheets of FPCs 15, 15 are arranged corresponding to respective drive element lines of the actuator unit 101.

These FPCs 15, 15 are folded and arranged at both side surfaces of a base member 102 opposing to each other. Thus, in this invention, the flexible printed circuit boards only oppose at folded sections.

Now, a third embodiment is described with reference to FIGS. 9 to 14.

Figure 9:
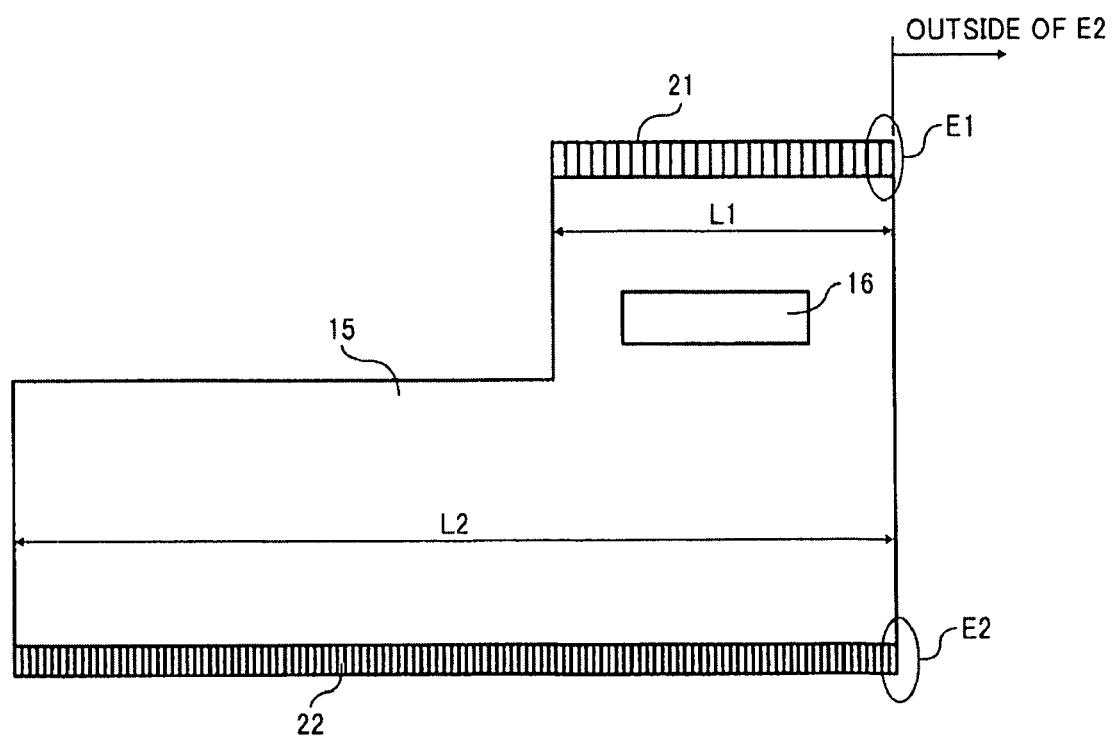
FIG. 9 is a chart illustrating an exemplary flexible printed circuit board according to third embodiment of the present invention.

As shown in FIG. 9, a length L1 of the input terminal section 21 is less than a half of that L2 of the output terminal section 22. Specifically, the input terminal section 21 is formed in a shape to be deviated from the center of the output terminal section 22, while the end E1 of the input terminal section 21 does not protrude from the side end E2 of the output terminal section 22.

Figure 10:
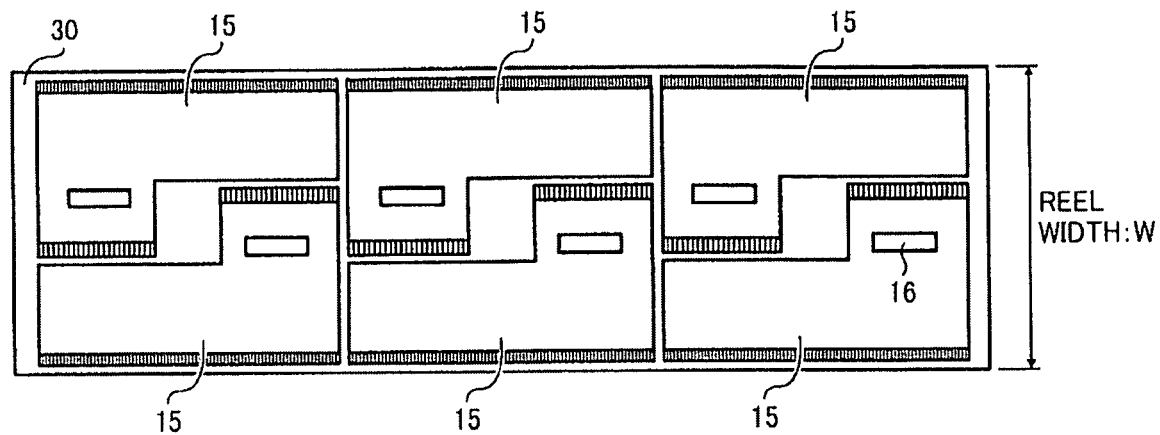
FIG. 10 is a chart illustrating an exemplary manner for picking up flexible printed circuit boards from a board as parts.
Figure 11:
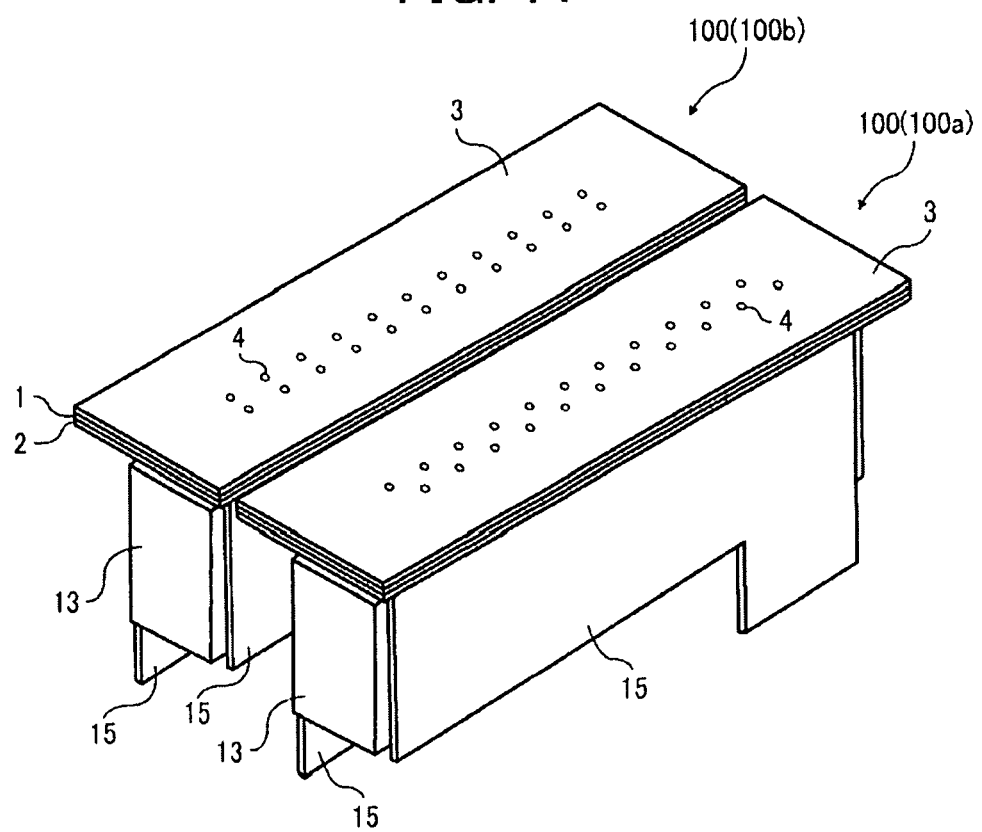
FIG. 11 is a schematic perspective view illustrating an exemplary liquid drop ejection head of the third embodiment.

Thus, the FPC 15 of this embodiment can avoid expansion of a length of the liquid drop ejection head in a longitudinal direction in comparison with that in the first embodiment. Further, as shown in FIG. 10, plural sheets of the FPC 15 are generally manufactured by repeating a wiring pattern while mounting drive ICs 16 onto a reel state film material 30 per parts. It is preferable to suppress material cost due to cost of the FPC. Thus, it is important to pick up many parts from the film material 30 with a prescribed width. As shown in FIG. 10, by executing layout to be able to pick up two sheets of FPCs 15 and 15 in the reel widthwise direction W having a shape of FIG. 15, a sufficient number of parts can be picked up therefrom.

Figure 12:
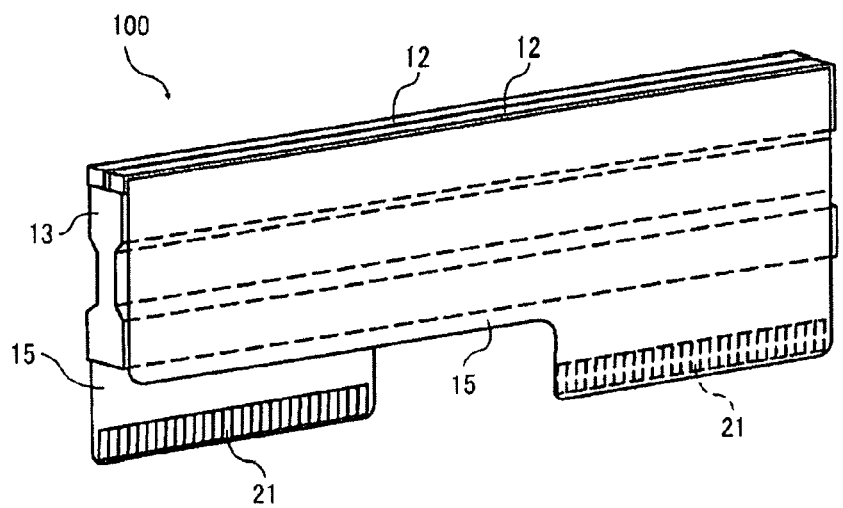
FIG. 12 is a perspective view illustrating an exemplary actuator unit of the liquid drop ejection head, which mounts the flexible printed circuit board.

Further, as shown in FIG. 12, as a liquid drop ejection head, two actuator units 100a and 100b are arranged side by side in a direction perpendicular to the nozzle arrangement direction while four lines of piezoelectric elements (i.e., drive element lines) 12 are arranged. These two actuator units 100a and 100b are installed in a single frame member 37. In the single actuator unit 100, similar to the above-mentioned embodiment, two sheets of the same FPCs 15 are arranged opposing to each other via the base member 13 while the respective input terminals 21 thereof do not face each other. Thus, four lines of FPCs 15 are arranged in a direction perpendicular to the alignment direction of the drive elements.

Figure 13:
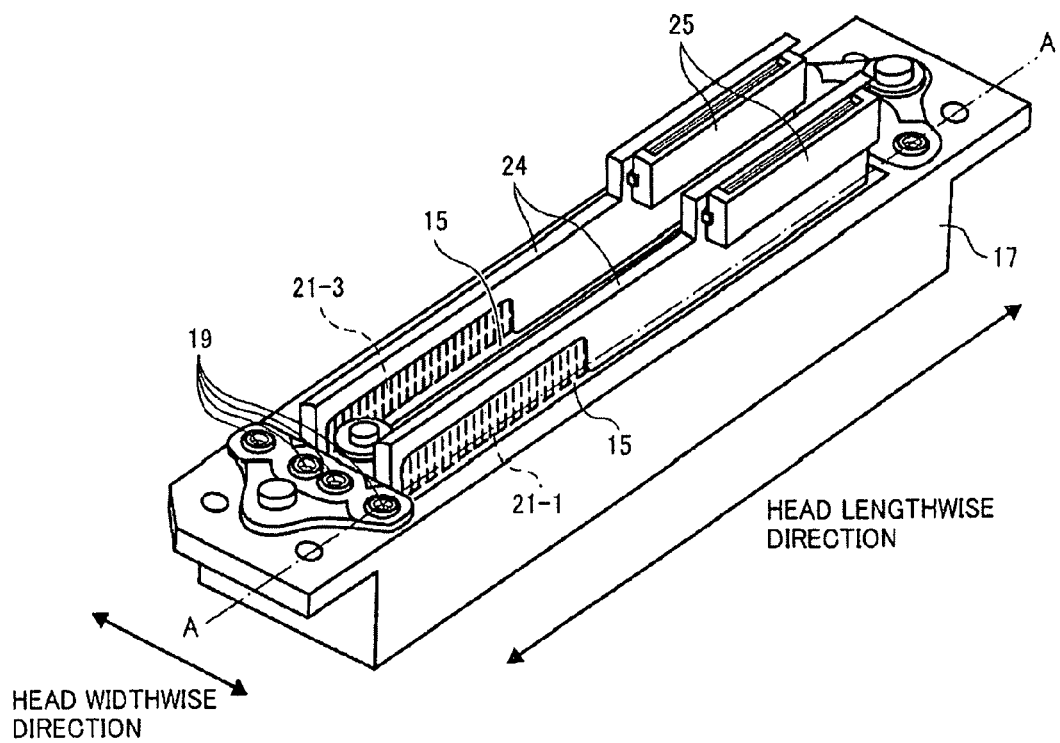
FIG. 13 is a perspective view illustrating the exemplary liquid drop ejection head that mounts a wiring board when viewed from an opposite side to a nozzle surface thereof.
Figure 14:
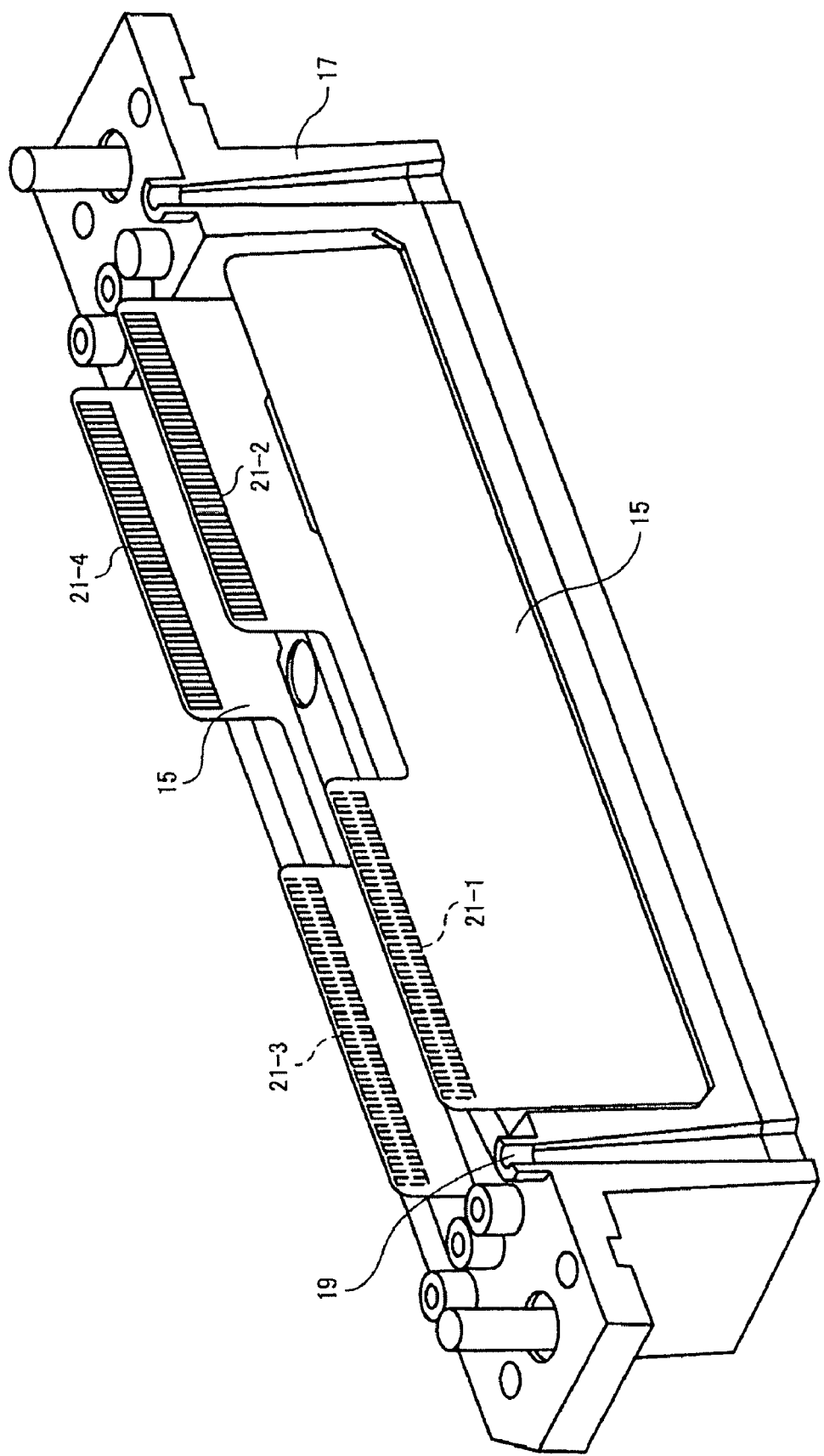
FIG. 14 is a perspective cross sectional view of the liquid drop ejection head of in FIG. 13 when a frame is removed and viewed along the line A-A as shown in FIG. 13.

As shown in FIGS. 13 and 14, each of the input terminals 21-1 to 21-4 of the four lines (four sheets) of the FPCs 15 is connected to a single sheet of the wiring board 24 in the liquid drop ejection head. Since these input terminals 21-1 and 21-2, and 21-3 and 21-4 do not oppose to each other, respectively, concentration of the wiring can be avoided at connecting sections of the wiring board 24. Thus, a number of layers of the wiring board can be decreased at low cost.

As for the number of arrangement of the drive elements and the FPCs 15, the present invention is not limited to the above, and includes various numbers of at least not less than three.

Figure 15:
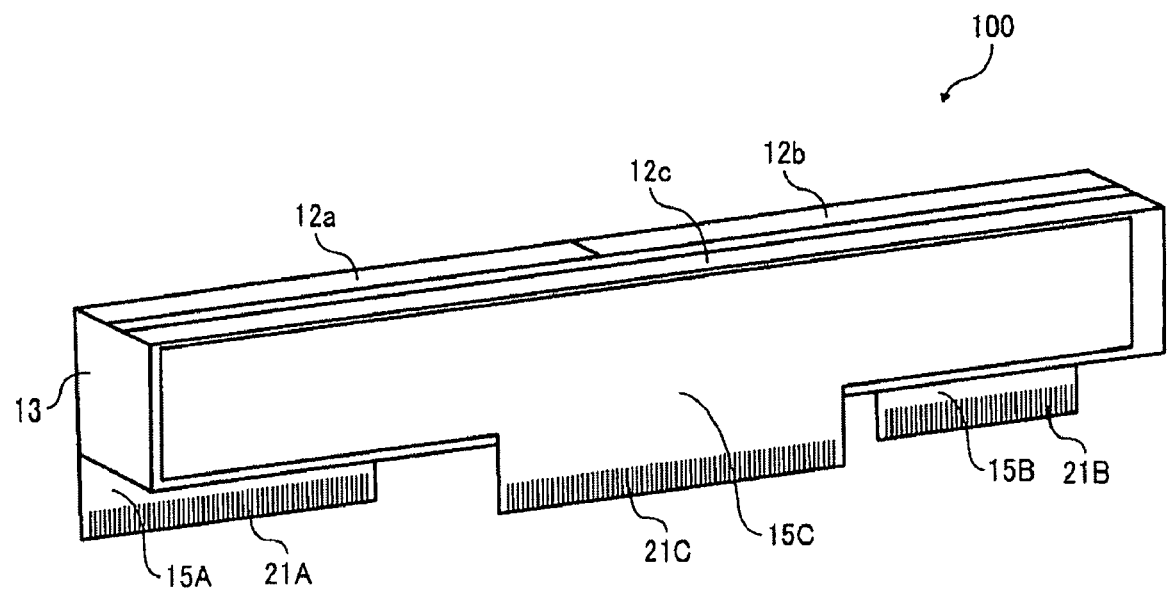
FIG. 15 is a perspective view illustrating an actuator unit of the liquid drop ejection head, which mounts the flexible printed circuit board according to a fourth embodiment of the present invention.

Now, a fourth embodiment of the present invention is described with reference to FIG. 15. As shown, the actuator unit 100 includes two relatively short piezoelectric elements 12a and 12b arranged side by side. The actuator unit 100 further includes a piezoelectric element 12c having a length as same as the sum of the two piezoelectric elements 12a and 12*b* arranged side by side, which is arranged in parallel to the two piezoelectric elements 12*a* and 12*b*.

Then, plural types of three sheets of the FPCs 15A, 15B, and 15C are used such that the FPCs 15A and 15B are arranged on the same surface and the FPC 15C is arranged on the opposite one via a baseboard 13. The input terminal 21C of the FPC 15C is not arranged to face the input terminals 21A and 21B. Then, similar to the first embodiment, the connection terminals 21C, 21A, and 21B are connected to a single wiring board 24, not shown.

Since the input terminal sections of the FPCs do not face other regardless of numbers of the FPCs and lines of the drive element, concentration of wiring can be suppressed at the connection section of the wiring board, and a stacking number of layers of the wiring board can be decreased at low cost.

Now, a fifth embodiment is described with reference to FIGS. 16 to 20.

As shown, a liquid drop ejection head 300 using an electrostatic actuator as a drive element and an ink tank 500 serving as a liquid container for supplying ink to a liquid drop ejection head 300 mounting a FPC 400 are integrated so as to form an ink cartridge (i.e., a liquid drop ejection head unit) as a liquid cartridge.

Figure 18:
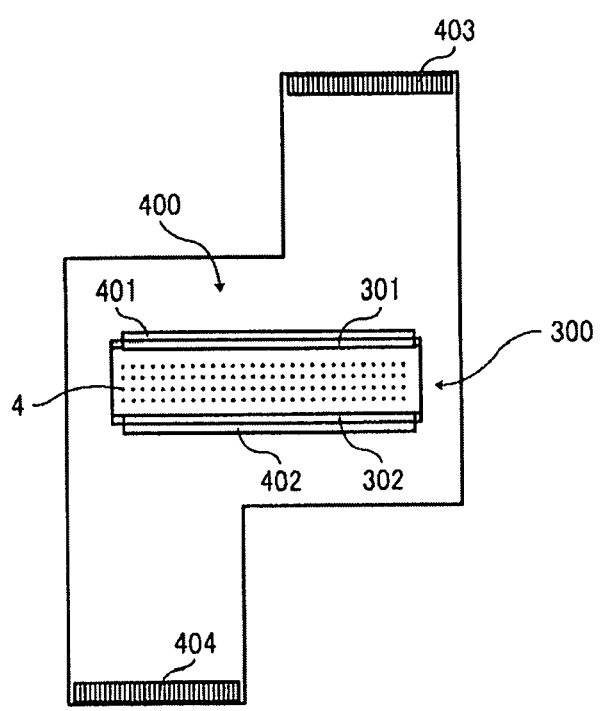
FIG. 18 is a plan view illustrating an exemplary condition where a liquid drop ejection head is attached onto a flexible printed circuit board.
Figure 19:
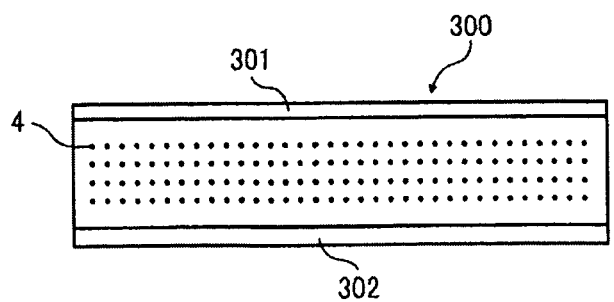
FIG. 19 is a plan view illustrating an exemplary liquid drop ejection head.
Figure 20:
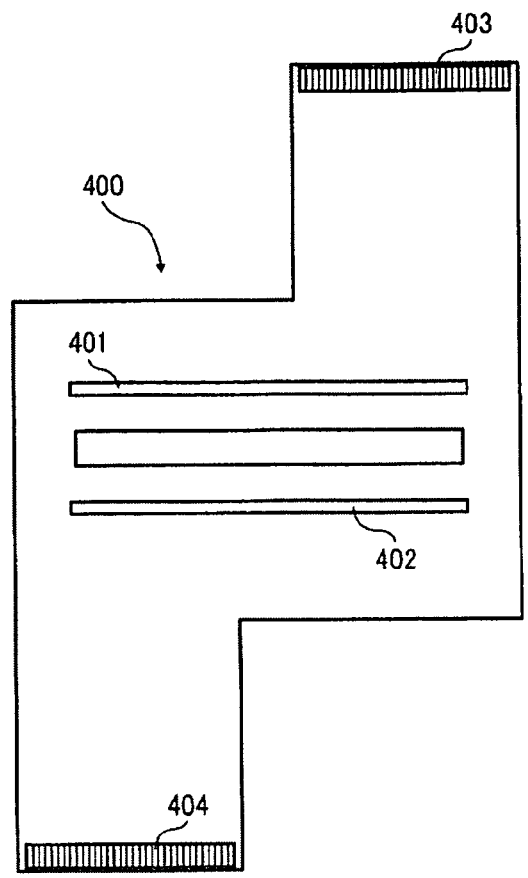
FIG. 20 is a chart illustrating an exemplary flexible printed circuit board.

As shown in FIG. 18, the liquid drop ejection head 300 includes four lines of nozzles 4 arranged side by side and connection terminal groups 301 and 302. A FPC 400 connected to an electrostatic actuator of the liquid drop ejection head 300 includes two output terminal sections 401 and 402 and two first and second input terminal sections 403 and 404. These first and second input terminal section 403 and 404 are positioned at different positions in the liquid drop ejection head 300 lengthwise direction (i.e., a nozzle alignment direction) so that they do not overlap with each other when folded in a direction perpendicular to the nozzle alignment direction.

Further, the liquid drop ejection head 300 and the FPC 400 are connected by connecting the connection terminal group 301 to the output terminal side 401, and connecting the connection terminal group 302 to the output terminal side 402 by wire bond, respectively. An isotropic conductive film and desoldering can be used instead of the wire bond.

Figure 16:
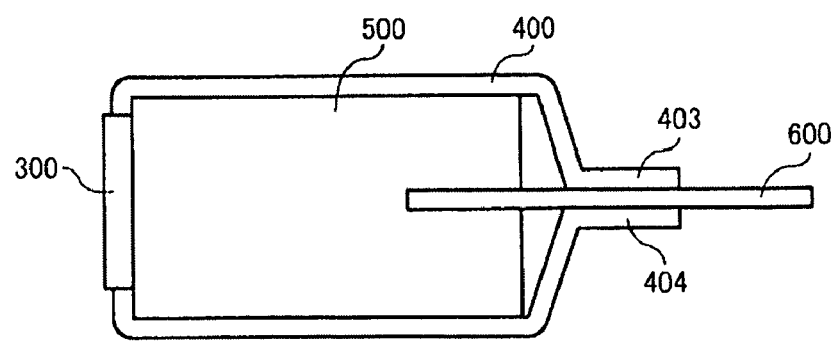
FIG. 16 is a side view illustrating a head unit integration type cartridge that mounts a flexible printed circuit board according to a fifth embodiment of the present invention.
Figure 17:
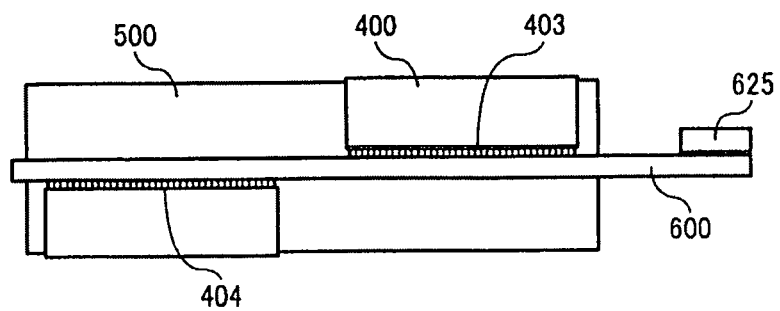
FIG. 17 is a bottom view illustrating an exemplary actuator unit when viewed from an ink tank side thereof.

Back to FIGS. 16 and 17, a wiring board 600 having a connecter 625 is arranged on the rear side surface of the ink tank 500. The input terminal sections 403 and 404 are connected to the wiring board 600 when the FPC 400 almost wraps the ink tank 500.

Since the first input terminal section 403 does not face the input terminal section 404 of the FPC 400 via the wiring board 600, concentration of wiring can be suppressed at a connection section of the wiring board, while decreasing a stacking number of layers of the wiring board at low cost. Since the liquid drop ejection head unit of this embodiment is like an ink cartridge integrating the ink tank with the liquid drop ejection head, the ink cartridge can be downsized in the liquid drop ejection head widthwise direction.

In this way, the wiring board is arranged perpendicular to the surface of the nozzle in parallel to the liquid drop ejection head longitudinal direction within a width of the surface of the nozzle of the liquid drop ejection head. Further, the flexible printed circuit board includes the first and second input terminal sections, and a wiring region extending from the first and second input terminal sections thereon partially faces each other, collectively be connected to the single wiring board. In addition, the first and second input terminal sections are arranged not face each other. As a result, the liquid drop ejection head can be downsized in the head width direction. Concentration of wiring can be suppressed on the wiring board, while decreasing a stacking number of layers of the wiring board at low cost. The liquid drop ejection head integrated ink cartridge can also be downsized.

Although the head integrated ink cartridge is exemplified in the above, the present invention can be applied to a relay unit or a head supporting board.

Figure 21:
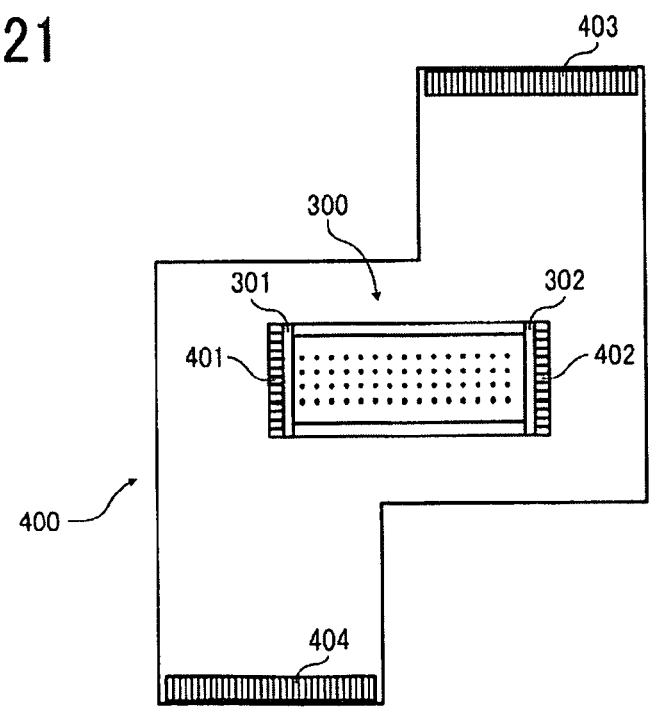
FIG. 21 is a plan view illustrating a sixth embodiment in which an exemplary liquid drop ejection head is attached onto a flexible printed circuit board.

Now, a sixth embodiment of the present invention is described with reference to FIG. 21. As shown, plural connection terminal groups are arranged at both side ends of a liquid drop ejection head 300 in the lengthwise direction to be connected to output terminal sections 401 and 402, respectively. Thus, the liquid drop ejection head connection section and arrangement of the output terminal section of the FPC are not limited to the above-mentioned embodiments.

Figure 22:
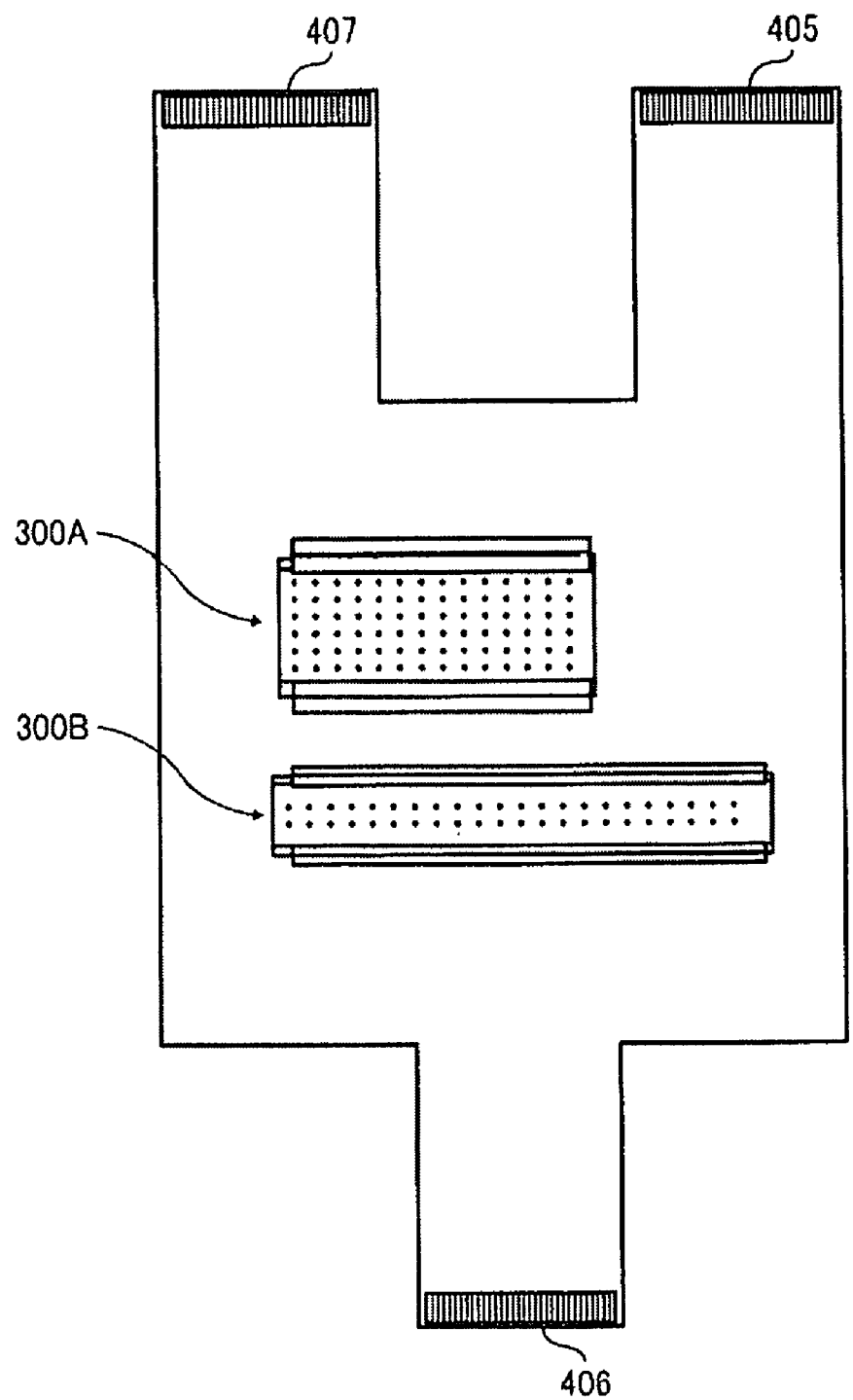
FIG. 22 is a plan view illustrating a seventh embodiment in which plural liquid drop ejection heads are attached onto a flexible printed circuit board.

Now, a seventh embodiment of the present invention is described with reference to FIG. 22. As shown, a drive element includes two liquid drop ejection heads 300A and 300B serving as an electrostatic actuator, while the FPC 400 includes three input terminal sections 405 to 407. The liquid drop ejection head 300A is used to eject liquid drop of color ink, while the liquid drop ejection bead 300B, black ink, respectively.

The input terminal section 406 of the FPC 400 has such a configuration that it does not face these two input terminal sections 405 and 407 via the wiring board when mounted. Thus, concentration of wiring can be suppressed at a connection section of the wiring board. Thus, the present invention can be applied to a device having at least two input terminal sections regardless of numbers of input terminal sections and drive elements.

Again, beside the electrostatic actuator employing the electrostatic force, a thermal actuator that uses an electricity/heat conversion element such as a heat generation resistance, in accordance with a phase change caused by film boiling of liquid, the above-mentioned piezoelectric element actuator can be used as the drive element.

Figure 23:
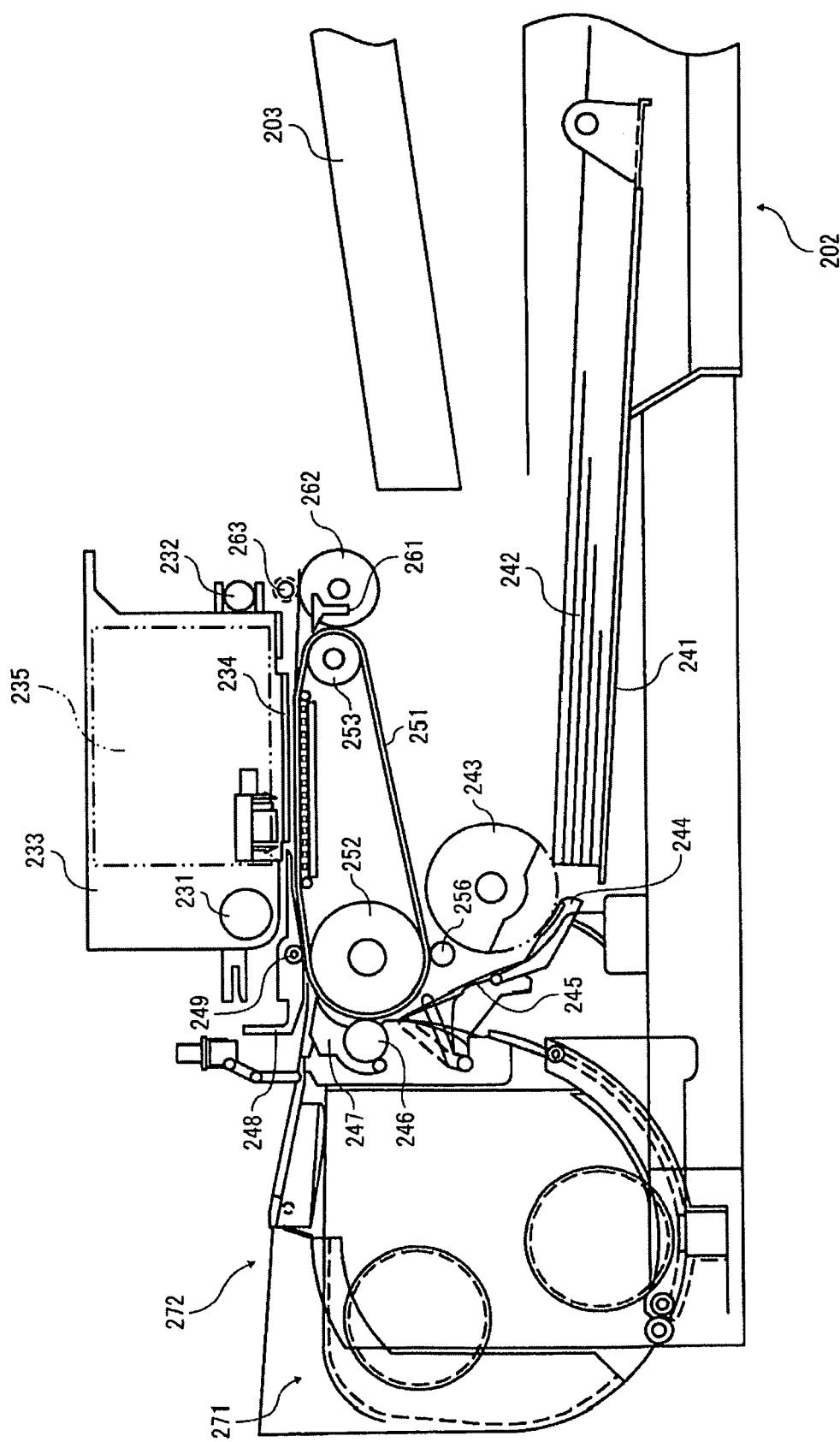
FIG. 23 is a schematic chart illustrating an exemplary entire mechanism used in an image forming apparatus that employs a liquid drop ejection head of the present invention.
Figure 24:
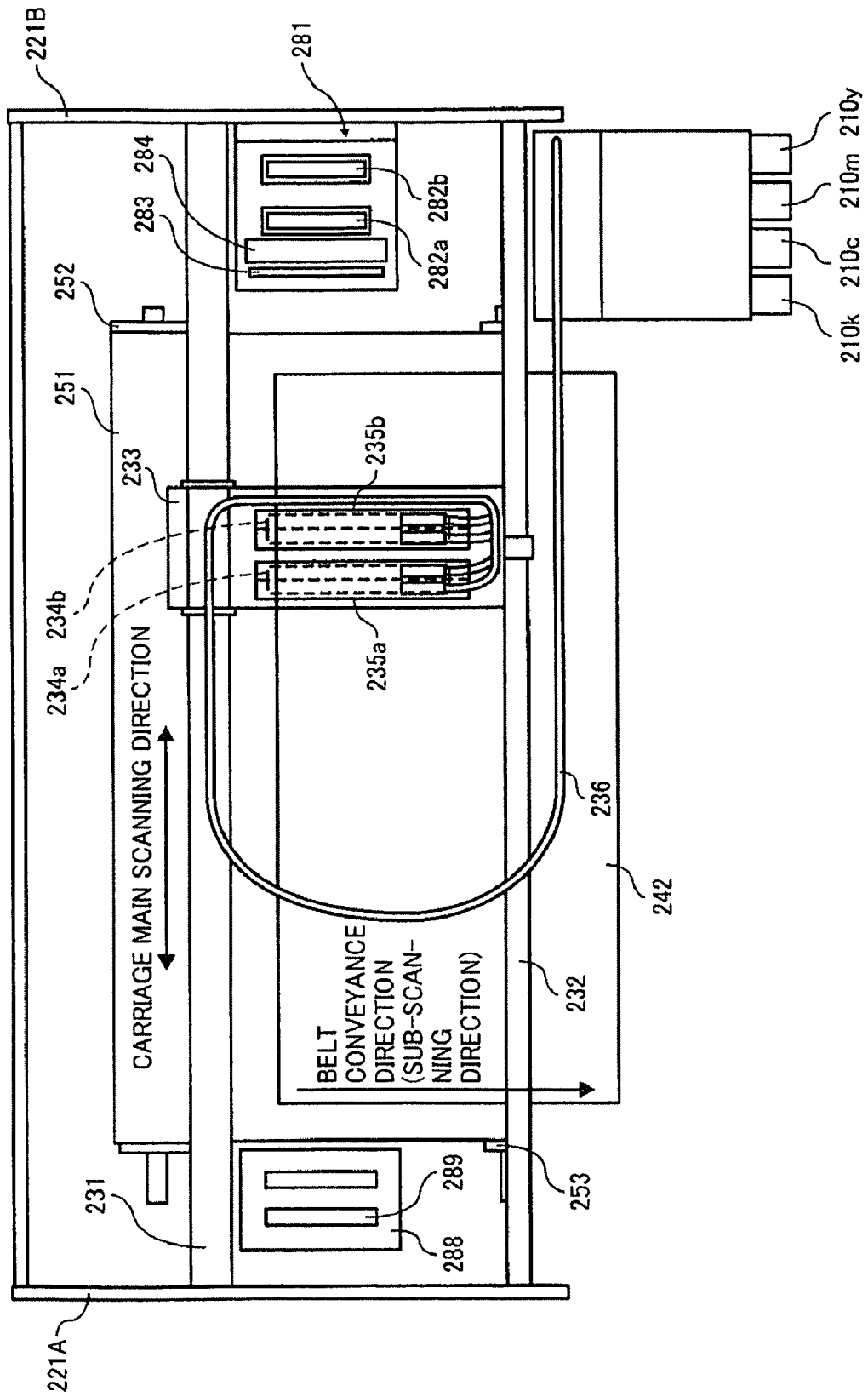
FIG. 24 is plan view of a relevant part of the mechanism.

Now, an exemplary image forming apparatus having a liquid drop ejection head of the present invention is described with reference to FIGS. 23 and 24. The image forming apparatus is a serial type, in which a carriage 233 is held slidably in a main scanning direction by main and sub guide rods 231 and 232 serving as a guide member suspended by a pair of left and right side plates 201A and 201B. The carriage 233 is moved by a main scanning motor, not shown, via a timing belt to execute scanning in a direction as shown by an arrow.

The carriage 233 includes plural print heads 234*a* and 234*b* (collectively called a printing head 234) having liquid drop ejection heads for ejecting ink drop of respective colors of yellow (Y), cyan (C), magenta (M), and black (K). Specifically, two nozzle lines each having plural nozzles are arranged in the sub scanning direction perpendicular to the main scanning direction facing downward.

One of nozzle lines of the printing head 234*a* ejects black ink drop, while the other, cyan ink drop, respectively. Similarly, one of nozzle lines of the printing head 234*b* ejects magenta ink drop, while the other, yellow ink drop, respectively.

Further, the carriage 233 mounts plural head tanks 235*a* and 235*b* (collectively called a head tank 35) for supplying ink of respective colors in accordance with the nozzle line of the printing head 234. To this sub tank 235, ink of the respective colors are supplied and replenished from ink cartridges 210*k*, 210*c*, 210*m*, and 210*y* of the respective colors via supply tubes 36.

In a sheet feeding section for feeding sheets 242 stacked on a sheet stacking section 241 of a sheet-feeding tray 202, a half moon roller of a sheet feeding roller 243, which separates and feeds sheets one by one from the a sheet stacking section 241 is provided. A separation pad 244 made of material having a large friction coefficient is also provided contacting the sheet-feeding roller 243. The separation pad 244 is biased toward the sheet-feeding roller 243.

To convey the sheet 242 fed from the sheet feeding section to a section below the printing head 234, a guide member 245 for guiding the sheet 242, a counter roller 246, a conveyance guide member 247, a depressing member 248 having a leading end pressure roller 249 are provided. Also provided is a conveyance belt 251 for electro-statically attracting and conveying the sheet 242 to a position opposing the printing head 234.

The conveyance belt 251 is endless and is wound around the conveyance roller 252 and a tension roller 253 so as to circulate in a belt conveyance direction (i.e., a sub scanning direction). Further, a charge roller is provided to charge the surface of the conveyance belt 251. The charge roller 256 contacts the surface of the conveyance belt 251 and is driven by the conveyance belt 251 as it rotates. The conveyance belt 251 circulates in the belt conveyance direction when the conveyance roller 252 is driven rotated by a sub scanning motor, not shown.

Further, as a sheet ejection section for ejecting sheets 242 printed by the printing head 234, a separation pick 261 for separating the sheet 242 fed from the conveyance belt 251, an sheet ejection rollers 262 and 263, and a sheet ejection tray 203 arranged below the an sheet ejection roller 262 are provided.

Further, a duplex unit 271 is detachably mounted on the rear side section of the apparatus body. The duplex unit 271 takes in the sheet 242 returned by the conveyance belt 251 reversely rotated and inverts and further conveys the sheet between the counter roller 246 and the conveyance belt 251. Further, the duplex unit 271 includes a manual sheet feed tray 272 on its upper surface.

Further, a maintenance recovery mechanism 281 is arranged in a non-printing region on one side of the scanning direction of the carriage 233 to maintain and recover a nozzle condition of the printing head 2354. The maintenance recovery mechanism 281 includes plural caps 282a and 282b for capping respective nozzle surfaces of the printing head 234, a wiper blade 283 of a blade member for wiping the nozzle surface, and a trial ejection receiver 284 for receiving liquid drop when trial ejection of liquid drop with increased viscosity not used for printing is executed and the like.

Further, in the non-print region 233 on the other side of the scanning direction of the carriage 233, an ink collection unit 288 is provided to receive liquid drop during the trial ejection. The ink collection unit 288 includes an opening 289 along the nozzle line direction of the printing head 234.

In thus constituted image forming apparatus, the sheet 242 is separated and fed one by one from the sheet feeding tray 202. The sheet 242 is fed substantially vertically upward and is guided by the guide 245. The sheet 242 is pinched by the conveyance belt 251 and the counter roller 246 and is further fed. The leading end of the sheet 242 is guided by the conveyance guide 237 and is depressed by the leading end pressure roller 249 to the conveyance belt 251. A conveyance direction of the sheet 242 is then changed by an angle of about 90 degree.

At this moment, an alternating current is applied to the charge roller 256 to generate plus and minus outputs alternatively. As a result, the conveyance belt 251 carries an alternating charge voltage pattern such that band state plus and minus charge sections each having a prescribed width appear alternately. When fed onto the conveyance belt 251 with alternative plus and minus charges, the sheet 242 is attracted and is conveyed as the belt 251 circulates in the sub scanning direction.

Then, by driving the printing head 234 by ejecting ink drop onto the sheet stopped in accordance with an image signal while moving the carriage 233, one line of printing is executed. Then, the sheet 242 is advanced by a prescribed conveying amount and is stopped. Then, the next printing is executed. When a print end signal or a signal representing arrival at a printing region of the trailing end is received, the printing operation is terminated and the sheet 242 is ejected onto the sheet ejection tray 203.

In this way, since the image forming apparatus includes the liquid drop ejection head according to the present invention, the apparatus can be downsized.

Figure 25:
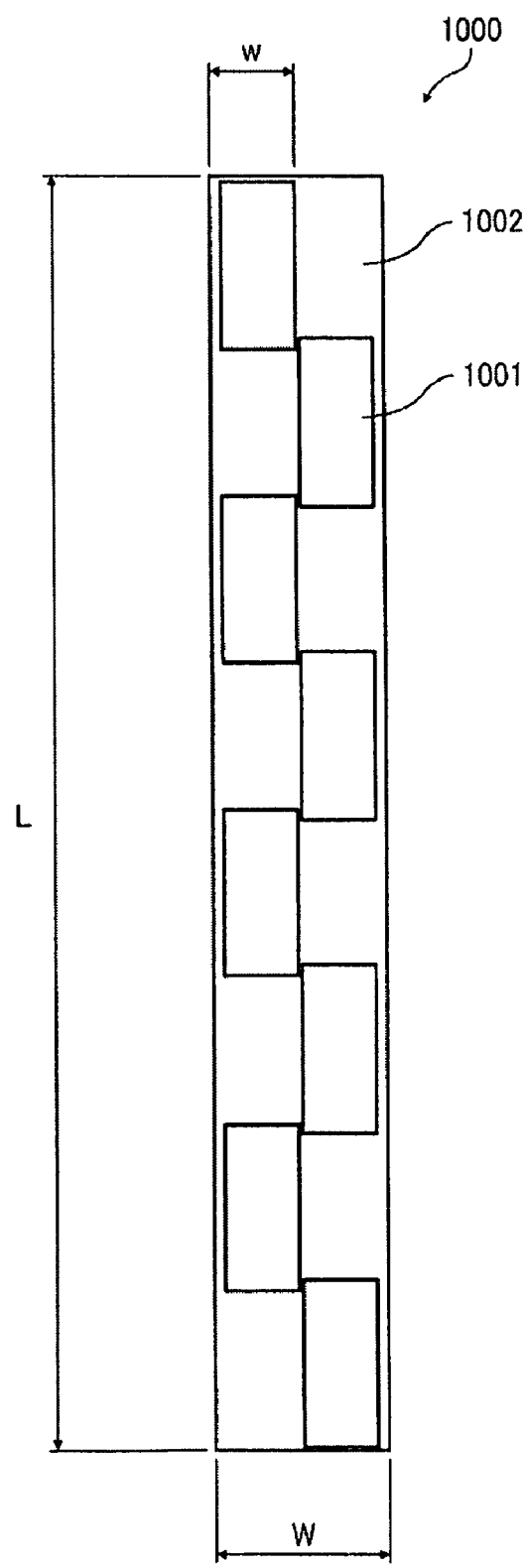
FIG. 25 is chart illustrating an exemplary line type liquid drop ejection head.

Although the image forming apparatus of the printer type configuration is mentioned above, the present invention can be applied to the other type of image forming apparatus, such as a printer, a fax, a copier, a multifunctional machine, etc. Further, the present invention can also be applied to an image forming apparatus employing a liquid drop ejection head using resist, DNA test piece, etc., beside the ink. Further applied is a line type liquid drop ejection head such as the liquid drop ejection head unit as described with reference to FIG. 25 or a line type image forming apparatus.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A liquid drop ejection head unit, comprising:
   at least two lines of at least two nozzles formed on a nozzle plate;
   at least two lines of at least two drive elements configured to generate energy for ejecting liquid drop through at least two nozzles;
   at least two sheets of flexible printed circuit boards configured to input signals to the at least two drive elements, each of said at least two sheets of flexible printed circuit boards including input and output terminals, said input terminal taking in a signal, said output terminal outputting the signal to one of the at least two drive elements; and
   a wiring board configured to connect to the input terminals of the at least two sheets of flexible printed circuit boards and configured to transfer the signal to the input terminal;
   wherein said wiring board is arranged in parallel to the nozzle line within a width of nozzle plate, and
   wherein said at least two sheets of the flexible printed boards are arranged opposing to each other via the wiring board, and
   wherein said input terminals respectively arranged on the at least two sheet of the flexible printed boards are positioned not to face each other.

2. The liquid drop ejection head unit as claimed in claim 1, wherein said input terminal is displaced from a center of one of the at least two lines of at least two drive elements.

3. The liquid drop ejection head unit as claimed in claim 1, wherein said input and output terminals are formed in parallel to each other, and wherein a length of the input terminal is not more than a half of the output terminal.

4. The liquid drop ejection head unit as claimed in claim 1, wherein said at least two sheets of flexible printed boards are formed substantially in the same shape.

5. The liquid drop ejection head unit as claimed in claim 1, wherein said wiring board mounts a bypass condenser.

6. A liquid drop ejection head unit, comprising:
- at least two lines of at least two nozzles formed on a nozzle plate;
- at least two lines of at least two drive elements configured to generate energy for ejecting liquid drop through at least two nozzles;
- at least one sheet of a flexible printed circuit board configured to input signals to the at least two drive elements, said at least one sheet of a flexible printed circuit board including at least two input terminals and at least one output terminal, said least two input terminals taking in a signal, said output terminal outputting the signal to one of the at least two drive elements; and
- a wiring board configured to connect to the input terminals of the at least one sheet of a flexible printed circuit board and configured to transfer the signal to the input terminal;
- wherein said at least one sheet of flexible printed circuit board is folded into a half around an axis in parallel the line of the nozzle and attached to the nozzle plate; and
- wherein said least two input terminals are arranged not to face each other.

7. An image forming apparatus including a liquid drop ejection head, said liquid drop ejection head comprising:
- at least two lines of at least two nozzles formed on a nozzle plate;
- at least two lines of at least two drive elements configured to generate energy for ejecting liquid drop through at least two nozzles;
- at least two sheets of flexible printed circuit boards configured to input signals to the at least two drive elements, each of said at least two sheets of flexible printed circuit boards including input and output terminals, said input terminal taking in a signal, said output terminal outputting the signal to one of the at least two drive elements; and
- a wiring board configured connect to the input terminals of the at least two sheets of flexible printed circuit boards;
- wherein said wiring board is arranged in parallel to the nozzle line within a width of nozzle plate, and
- wherein said at least two sheets of the flexible printed boards are arranged opposing to each other via the wiring board, and
- wherein said input terminals respectively arranged on the at least two sheet of the flexible printed boards are positioned not to face each other.

* * * * *